US012574656B1

(12) United States Patent
Lin et al.

(10) Patent No.: US 12,574,656 B1
(45) Date of Patent: Mar. 10, 2026

(54) IMAGE SENSOR

(71) Applicant: VisEra Technologies Company Ltd.,
Hsin-Chu (TW)

(72) Inventors: Cheng-Hsuan Lin, Hsin-Chu (TW);
Jian-Wen Luo, Hsin-Chu (TW);
Ching-Hua Li, Hsin-Chu (TW);
Shin-Hong Kuo, Hsin-Chu (TW)

(73) Assignee: VisEra Technologies Company Ltd.,
Hsin-Chu (TW)

( * ) Notice: Subject to any disclaimer, the term of this
patent is extended or adjusted under 35
U.S.C. 154(b) by 41 days.

(21) Appl. No.: 18/830,726

(22) Filed: Sep. 11, 2024

(51) Int. Cl.
H04N 25/13 (2023.01)
H04N 25/704 (2023.01)
H10F 39/00 (2025.01)
H10F 39/18 (2025.01)
H04N 25/133 (2023.01)

(52) U.S. Cl.
CPC .......... H04N 25/13 (2023.01); H04N 25/134
(2023.01); H04N 25/704 (2023.01); H10F
39/18 (2025.01); H10F 39/8053 (2025.01);
H04N 25/133 (2023.01); H04N 25/136
(2023.01)

(58) Field of Classification Search
CPC .... H04N 25/13; H04N 25/133; H04N 25/134;
H04N 25/135; H04N 25/136; H04N
25/704; H10F 39/8053
See application file for complete search history.

(56) References Cited

U.S. PATENT DOCUMENTS

2019/0250309 A1* 8/2019 Hsu ...................... G02B 3/0006
2022/0173144 A1* 6/2022 Lee ..................... H10F 39/8063

* cited by examiner

*Primary Examiner* — Daniel M Pasiewicz
(74) *Attorney, Agent, or Firm* — MUNCY, GEISSLER,
OLDS & LOWE, P.C.

(57) ABSTRACT

An image sensor including a phase detection auto focus
(PDAF) sensing unit. The PDAF sensing unit includes a
plurality of photodiodes and a hybrid color filter disposed on
a group of the plurality of photodiodes. The hybrid color
filter includes a first material and a second material directly
in contact with each other, an extinction coefficient of the
first material is substantially equal to an extinction coeffi-
cient of the second material, and an index of refraction of the
first material is different from an index of refraction of the
second material.

20 Claims, 17 Drawing Sheets

100K

104

110G

110R

110G

140 { 1401, 1402 }

120 { 140, 130 }

130

110G

110B

104

100L

110R

110G

110G

110B

110G 1401
1402 } 140

130 } 120

140

1

IMAGE SENSOR

BACKGROUND

Field of Invention

The present disclosure relates to an image sensor.

Description of Related Art

An image sensor is a semiconductor device that converts light images into electrical signals. Image sensors are generally divided into charge-coupled device (CCD) and complementary metal-oxide-semiconductor (CMOS) image sensors. In the above image sensor, the complementary metal-oxide-semiconductor image sensor includes a photodiode for detecting incident light and converting it into an electrical signal, and a logic circuit for transmitting and processing the electrical signal.

In recent years, phase detection autofocus (PDAF) technology has been introduced into electronic products such as digital single-lens reflex cameras (DSLR), digital still cameras (DSC), and smartphone cameras. Traditional PDAF principle is to add a half-shielding layer on the adjacent pixels. The signal difference between the adjacent pixels creates the PDAF function. However, the half-shielded pixels would lose half of the incident light, which is lower than the standard pixels, resulting in poor signal acquisition.

Therefore, it is desirable to develop a novel image sensor structure that can implement a PDAF function and has a high-quality image capture effect.

SUMMARY

An aspect of the disclosure an image sensor including a phase detection auto focus (PDAF) sensing unit. The PDAF sensing unit includes a plurality of photodiodes and a hybrid color filter disposed on a group of the plurality of photodiodes. The hybrid color filter includes a first material and a second material directly in contact with each other, an extinction coefficient of the first material is substantially equal to an extinction coefficient of the second material, and an index of refraction of the first material is different from an index of refraction of the second material. The first material and the second material satisfy the following equation:

$$|k_L(\lambda_1)-k_R(\lambda_1)|+|k_L(\lambda_2)-k_R(\lambda_2)|+ \ldots +|k_L(\lambda_n)-k_R(\lambda_n)| < (n-1) \times 0.01$$

in which $k_L(\lambda)$ is the extinction coefficient of the first material, $k_R(\lambda)$ is the extinction coefficient of the second material, n is a positive integer, $\lambda$ is a filter spectrum of the hybrid color filter and is in a range from 300 nm to 2000 nm. A difference between the index of refraction of the first material and the index of refraction of the second material is less than 2.

In some embodiments, a ratio of a dimension of the first material to a dimension of the second material is in a range from 0.5 to 1.5. A sum of a dimension of the first material and a dimension of the second material is equal to a dimension of adjacent two photodiodes of the plurality of photodiodes. A shape of each of the first material and the second material is a square, a rectangle, or a trapezoid, in a top view.

In some embodiments, the image sensor further includes a meta layer disposed on the hybrid color filter, wherein the meta layer includes a plurality of nano-structures.

In some embodiments, the image sensor further includes a micro lens layer disposed on the hybrid color filter.

In some embodiments, the phase detection auto focus sensing unit comprises a grid surrounding the hybrid color filter, and the first material and the second material are free of disposing the grid therebetween.

In some embodiments, the group of photodiodes includes a first photodiode and a second photodiode disposed adjacent the first photodiode, the first material is disposed on the first photodiode, and the second material is disposed on the second photodiode.

In some embodiments, the group of photodiodes includes a first photodiode and a second photodiode disposed adjacent the first photodiode, the first material is disposed on the first photodiode, and the second material is disposed on both the first photodiode and the second photodiode.

In some embodiments, the group of photodiodes includes four photodiodes disposed in a 2×2 array, the first material is disposed on adjacent two of the four photodiodes, and the second material is disposed on two others of the four photodiodes.

In some embodiments, the group of photodiodes includes four photodiodes disposed in a 2×2 array, the first material includes two portions disposed on diagonal two of the four photodiodes, respectively, and the second material includes two portions disposed on two others of the four photodiodes, respectively.

In some embodiments, the plurality of photodiodes includes nine photodiodes disposed in a 3×3 array, the hybrid color filter is disposed on a middle column of the nine photodiodes, and the second material includes two portions disposed at opposite sides of the first material, respectively.

In some embodiments, the phase detection auto focus sensing unit further includes two mono color filters disposed on a left column and a right column of the nine photodiodes, respectively, wherein a filter spectrum of the mono color filters is same as a filter spectrum of the hybrid color filter.

In some embodiments, the plurality of photodiodes includes nine photodiodes disposed in a 3×3 array, the hybrid color filter is disposed on a middle row of the nine photodiodes, and the second material includes two portions disposed at opposite sides of the first material, respectively.

In some embodiments, the phase detection auto focus sensing unit further includes two mono color filters disposed on a top row and a bottom row of the nine photodiodes, respectively, wherein a filter spectrum of the mono color filters is same as a filter spectrum of the hybrid color filter.

In some embodiments, the plurality of photodiodes includes nine photodiodes disposed in a 3×3 array, the hybrid color filter is disposed on a middle row and a middle column of the nine photodiodes, and the second material includes four portions disposed at sides of the first material, respectively.

In some embodiments, the phase detection auto focus sensing unit further includes four mono color filters disposed on four corners of the nine photodiodes, respectively, wherein a filter spectrum of the mono color filters is same as a filter spectrum of the hybrid color filter.

In some embodiments, the plurality of photodiodes includes twenty-five photodiodes disposed in a 5×5 array, the first material is disposed on a center one of the twenty-five photodiodes, and the second material includes two portions disposed at opposite sides of the first material, respectively.

In some embodiments, the image sensor further includes a first mono color filter and a second mono color filter disposed diagonally on the plurality of photodiodes, and two third mono color filters disposed diagonally on the plurality of photodiodes, wherein a filter spectrum of the third mono color filters is same as a filter spectrum of the hybrid color filter.

In some embodiments, a filter spectrum of the first mono color filter is different from the filter spectrum of the hybrid color filter, and a filter spectrum of the second mono color filter is different from the filter spectrum of the hybrid color filter.

In some embodiments, the image sensor further includes an additional hybrid color filter, wherein the hybrid color filter and the additional hybrid color filter are disposed on a diagonal of the plurality of photodiodes, and a filter spectrum of the additional hybrid color filter is same as the filter spectrum of the hybrid color filter.

In some embodiments, the hybrid color filter corresponds to red color, green color, blue color, yellow color, clear color, magenta color, or cyan color.

According to the embodiments of the disclosure, the image sensor having the PDAF sensing unit is provided. The PDAF sensing unit includes the hybrid color filter including the first material and the second material. The extinction coefficient of the first material is substantially equal to the extinction coefficient of the second material, and the index of refraction of the second material is greater than the index of refraction of the first material. The light plunder behavior caused by the refraction index difference between first and second materials and of the hybrid color filter is introduced to the PDAF sensing unit to increase L/R ratio, and the sensitivity of the PDAF sensing unit is also improved.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
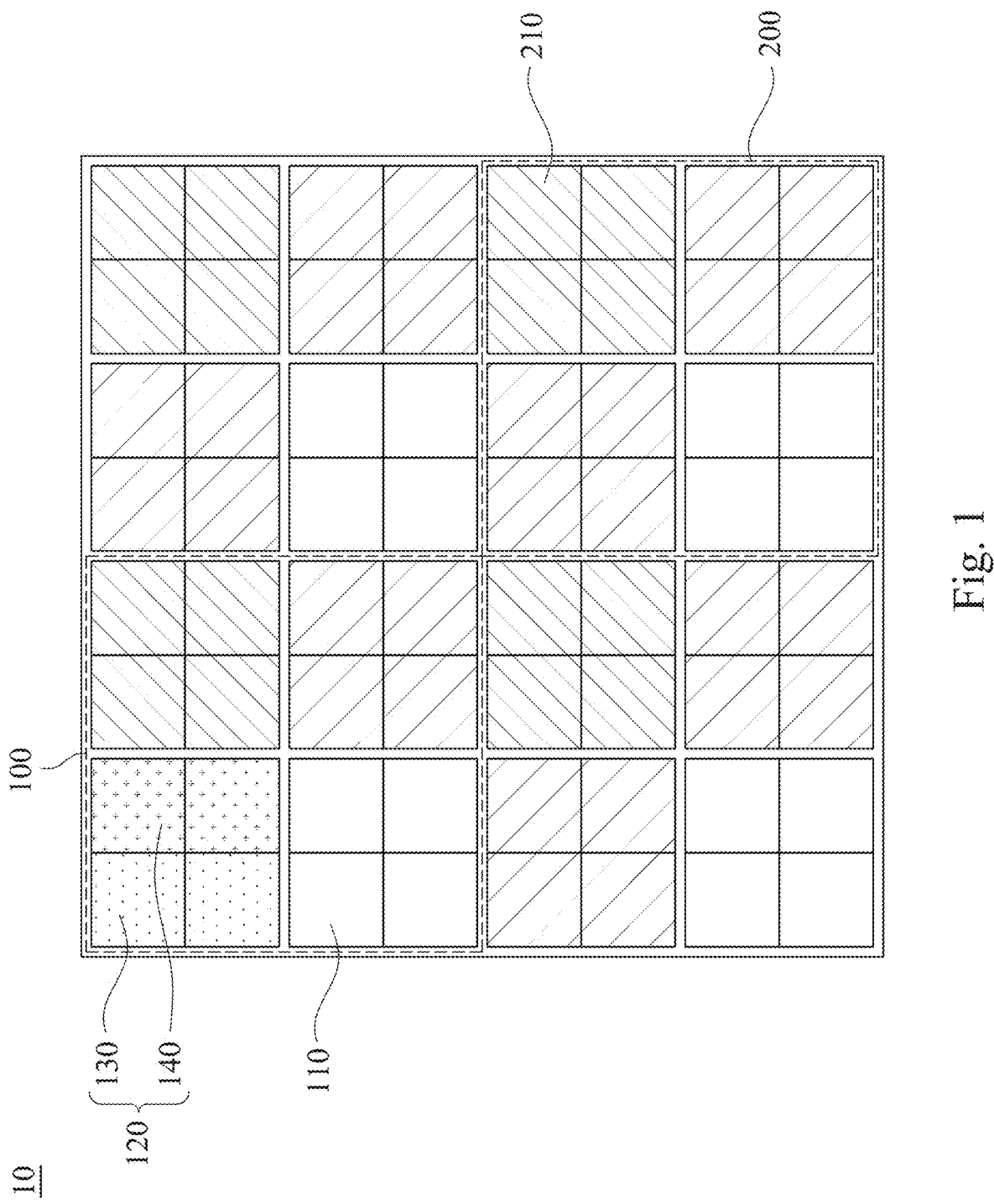
FIG. 1 is a schematic top view of an image sensor according to some embodiments of the disclosure.

Reference will now be made in detail to the present embodiments of the disclosure, examples of which are illustrated in the accompanying drawings. Wherever possible, the same reference numbers are used in the drawings and the description to refer to the same or like parts.

Further, spatially relative terms, such as "on," "over," "under," "between" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The words "comprise", "include", "have", "contain" and the like used in the present disclosure are open terms, meaning including but not limited to.

Reference is made to FIG. 1. FIG. 1 is a schematic top view of an image sensor according to some embodiments of the disclosure. The image sensor 10 includes at least one phase detection auto focus (PDAF) sensing unit 100 and a plurality of color sensing units 200. Each of the color sensing units 200 includes a plurality of color filters 210 of combinations corresponding to red color, green color, blue color, yellow color, clear color, magenta color, or cyan color. In some embodiments, the color filters 210 of each of the color sensing units 200 are arranged in a Bayer arrangement, and each of the color filters 210 covers multiple photodiodes. The PDAF sensing unit 100 includes a plurality of mono color filters 110 and a hybrid color filter 120. The mono color filters 110 correspond to combinations of red color, green color, blue color, yellow color, clear color, magenta color, or cyan color. The hybrid color filter 120 corresponds to red color, green color, blue color, yellow color, clear color, magenta color, or cyan color. The mono color filters 110 and the hybrid color filter 120 cover multiple photodiodes, respectively.

The hybrid color filter 120 includes a first material 130 and a second material 140 directly in contact with each other without a grid therebetween. The extinction coefficient of the first material 130 is substantially equal to the extinction coefficient of the second material 140, and the index of refraction of the first material 130 is different from the index of refraction of the second material 140.

In some embodiments, the extinction coefficient of the first material 130 or the second material 140 is same as the extinction coefficient of the material of one of the mono color filters 110 of the PDAF sensing unit 100, or the extinction coefficient of the first material 130 or the second material 140 is same as the extinction coefficient of the material of one of the color filters 210 of the color sensing units 200.

The PDAF sensing unit 100 of the disclosure includes the hybrid color filter 120 having the first material 130 and the second material 140 with a difference of index of refraction therebetween. A light plunder behavior can be introduced to the PDAF sensing unit 100 to increase L/R ratio when an incident light enters the PDAF sensing unit 100 with an incident angle.

Figures 2A, 2B:
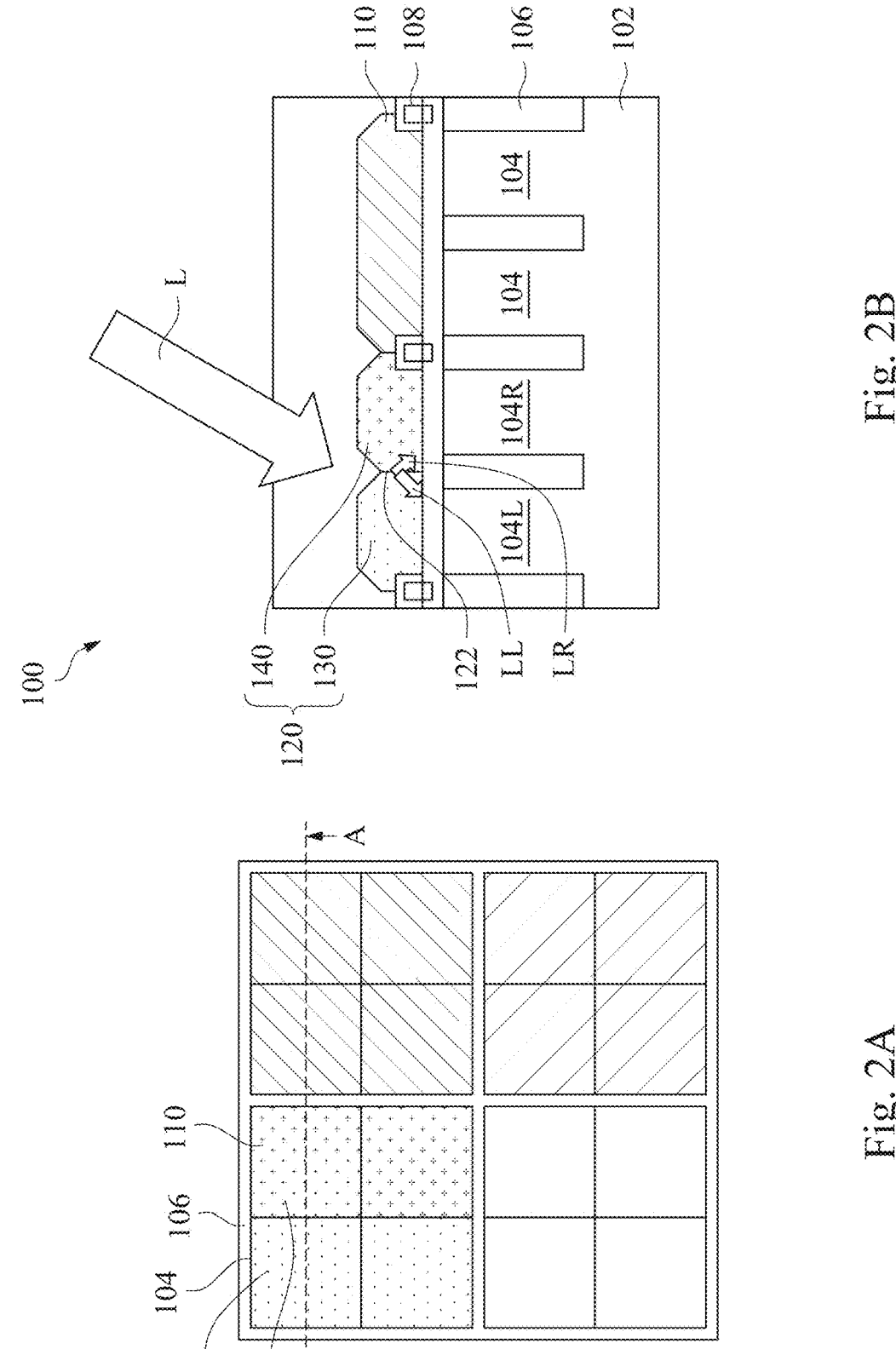
FIG. 2A is a schematic top view of the PDAF sensing unit of the image sensor according to some embodiments of the disclosure.
FIG. 2B and FIG. 2C are cross-sectional views of different embodiments of the PDAF sensing unit taken along line A-A of FIG. 2A, respectively.

Reference is made to FIG. 2A and FIG. 2B. FIG. 2A is a schematic top view of the PDAF sensing unit of the image sensor according to some embodiments of the disclosure. FIG. 2B is a cross-sectional view of some embodiments of the PDAF sensing unit taken along line A-A of FIG. 2A. The PDAF sensing unit 100 includes a plurality of photodiodes 104 formed in a substrate 102, and the photodiodes 104 are defined and spaced by a deep trench isolation (DTI) structure 106. The PDAF sensing unit 100 includes a grid 108 on the DTI structure 106. The grid 108 defines a plurality of apertures, and the PDAF sensing unit 100 includes the mono color filters 110 and the hybrid color filter 120 disposed on the photodiodes 104 and filled in the apertures defined by the grid 108. In some embodiments, each of the mono color filters 110 and the hybrid color filter 120 overlaps four photodiodes 104, and each of the photodiodes 104 is in a shape of square.

The hybrid color filter 120 includes the first material 130 and the second material 140 directly contacting each other without a grid therebetween. The extinction coefficient of the first material 130 is substantially equal to the extinction coefficient of the second material 140, and the index of refraction of the first material 130 is greater than the index of refraction of the second material 140.

When an incident light L with an incident angle reaches the interface 122 between the first material 130 and the second material 140, a light plunder behavior is raised because of the difference of index of refraction between the first material 130 and the second material 140. The incident light L splits at the interface 122 between the first material 130 and the second material 140 before it reaches the DTI structure 106.

The incident light L splits into a first incident light LL and a second incident light LR, in which the first incident light LL passes through the interface 122, and the second incident light LR is reflected by the interface 122. The first incident light LL passes the first material 130 of the hybrid color filter 120 and enters the underlying photodiodes 104L. The second incident light LR passes the second material 140 of the hybrid color filter 120 and enters the underlying photodiodes 104R.

The index of refraction of the first material 130 is greater than the index of refraction of the second material 140 so that the first material 130 plunders more light. That is, the energy of the first incident light LL passing the first material 130 is greater than the energy of the second incident light LR passing the second material 140. The L/R ratio, e.g. the ratio of the energy received by the photodiodes 104L under the first material 130 to the energy received by the photodiodes 104R under the second material 140, can be increased because the first material 130 with the greater index of refraction plunders more light.

Additionally, the incident light L splits before it reaches the DTI structure 106, and there is no half-shielding layer between the hybrid color filter 120 and the photodiodes 104. Therefore, it can be assumed that almost all of the energy of the incident light L is received by the photodiodes 104 under the hybrid color filter 120. Comparing to the traditional PDAF using the half-shielding layer, the energy received by the photodiodes 104 is greatly increased, and the sensitivity of the PDAF sensing unit 100 is improved.

Figure 2C:
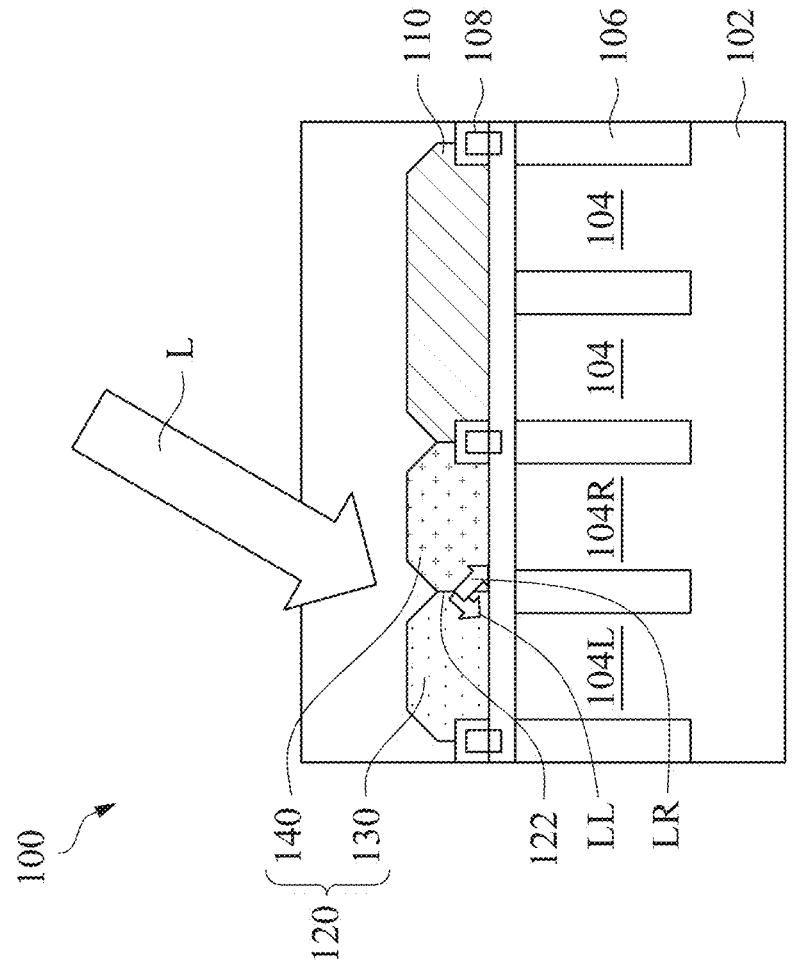

Reference is made to FIG. 2C. FIG. 2C is a cross-sectional view of some other embodiments of the PDAF sensing unit of the image sensor. In some embodiments, the hybrid color filter 120 includes the first material 130 and the second material 140 directly contacting each other without a grid therebetween. The extinction coefficient of the first material 130 is substantially equal to the extinction coefficient of the second material 140, and the index of refraction of the second material 140 is greater than the index of refraction of the first material 130.

The incident light L splits at the interface 122 between the first material 130 and the second material 140 before it reaches the DTI structure 106. For example, the incident light L splits into the first incident light LL and the second incident light LR, in which the first incident light LL passes through the interface 122 and enters the underlying photodiodes 104L, and the second incident light LR is reflected by the interface 122 and enters the underlying photodiodes 104R.

The index of refraction of the second material 140 is greater than the index of refraction of the first material 130 so that the second material 140 plunders more light. That is, the energy of the second incident light LR passing the second material 140 is greater than the energy of the first incident light LL passing the first material 130. The L/R ratio, e.g. the ratio of the energy received by the photodiodes 104R under the second material 140 to the energy received by the photodiodes 104L under the first material 130, can be increased because the second material 140 with the greater index of refraction plunders more light. Also, the energy received by the photodiodes 104 is greatly increased, and the sensitivity of the PDAF sensing unit 100 is improved.

According to the embodiments shown in FIG. 2A to FIG. 2C, the light plunder behavior caused by the refraction index difference between first and second materials 130 and 140 of the hybrid color filter 120 is introduced to the PDAF sensing unit 100 to increase L/R ratio. In some embodiments, the difference between the index of refraction of the first material 130 and the index of refraction of the second material 140 is greater than 0 and less than 2. In some embodiments, the difference between the index of refraction of the first material 130 and the index of refraction of the second material 140 is greater than 0.5, and the light plunder behavior is obvious in this design.

In some embodiments, the extinction coefficient ($k_L$ ($\lambda$)) of the first material 130 is substantially equal to the extinction coefficient ($k_R$ ($\lambda$)) of the second material 140. The extinction coefficient ($k_L$ ($\lambda$)) of the first material 130 and the extinction coefficient ($k_R$ ($\lambda$)) of the second material 140 satisfy the following equation:

$$|k_L(\lambda_1) - k_R(\lambda_1)| + |k_L(\lambda_2) - k_R(\lambda_2)| + \ldots + |k_L(\lambda_n) - k_R(\lambda_n)| < (n-1) \times 0.01,$$

in which n is a positive integer, $\lambda$ is the filter spectrum of the hybrid color filter 120, and $\lambda$ is in a range from 300 nm to 2000 nm.

In some embodiments, a sum of a dimension D1 of the first material 130 and a dimension D2 of the second material 140 is equal to a dimension D3 of adjacent two photodiodes 104, in which the dimension D3 is measured between centers of the DTI structure 106. In some embodiments, the dimension D1 of the first material 130 can be greater than, equal to, or less than the dimension D2 of the second material 140. In some embodiments, a ratio of the dimension D1 of the first material 130 to the dimension D2 of the second material 140 is in a range from 0.5 to 1.5.

Figures 3, 4:
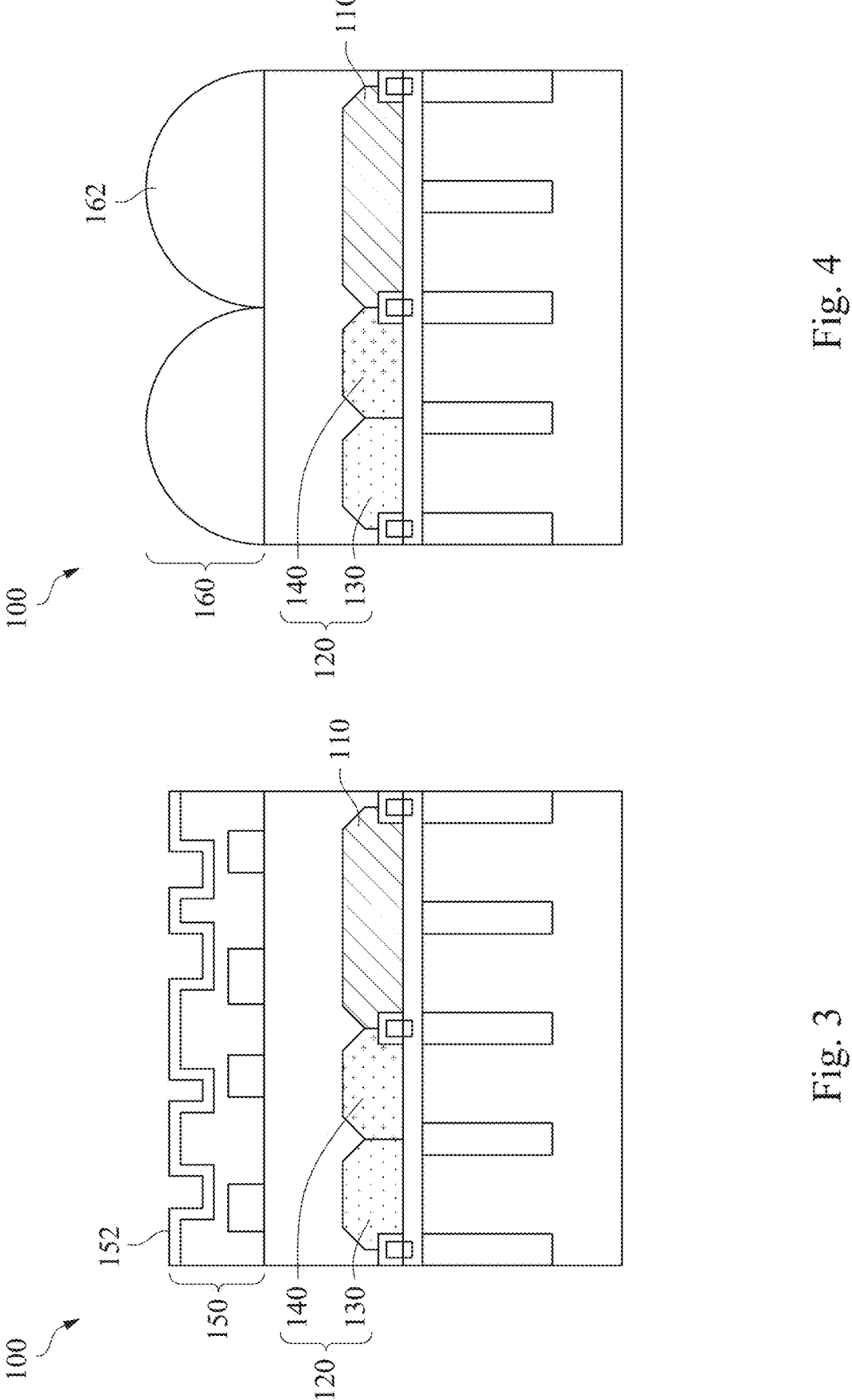
FIG. 3 is a cross-sectional view of the PDAF sensing unit of the image sensor according to some embodiments of the disclosure.
FIG. 4 is a cross-sectional view of the PDAF sensing unit of the image sensor according to some embodiments of the disclosure.

Reference is made to FIG. 3. FIG. 3 is a cross-sectional view of the PDAF sensing unit of the image sensor according to some embodiments of the disclosure. The PDAF sensing unit 100 further includes a meta layer 150 disposed on the hybrid color filter 120 and the mono color filters 110. In some embodiments, the meta layer 150 includes a plurality of nano-structures 152.

Reference is made to FIG. 4. FIG. 4 is a cross-sectional view of the PDAF sensing unit of the image sensor according to some embodiments of the disclosure. The PDAF sensing unit 100 further includes a micro lens layer 160 disposed on the hybrid color filter 120 and the mono color filters 110. In some embodiments, the micro lens layer 160 includes a plurality of micro lenses 162 disposed on the hybrid color filter 120 and the mono color filters 110, respectively.

Reference is made to FIG. 5 to FIG. 16. FIG. 5 to FIG. 16 are schematic top views of the PDAF sensing unit of the image sensor according to different embodiments of the disclosure, in which the schematic top views illustrate the color filter layer including the hybrid color filter and the mono color filters and the photodiode layer separately for better understanding. Please note that the red color, green color, blue color of the mono color filter 110 and the hybrid color filter 120 described in FIG. 5 to FIG. 13 are only for example, the colors of the mono color filter 110 and the hybrid color filter 120 can be combinations of red color, green color, blue color, yellow color, clear color, magenta color, or cyan color.

Figure 5:
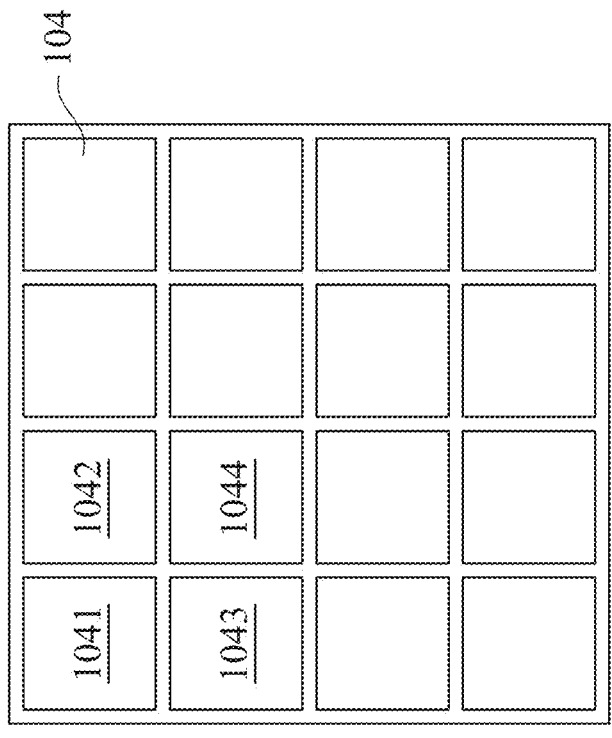
FIG. 5 to FIG. 16 are schematic top views of the PDAF sensing unit of the image sensor according to different embodiments of the disclosure.
Figure 5:
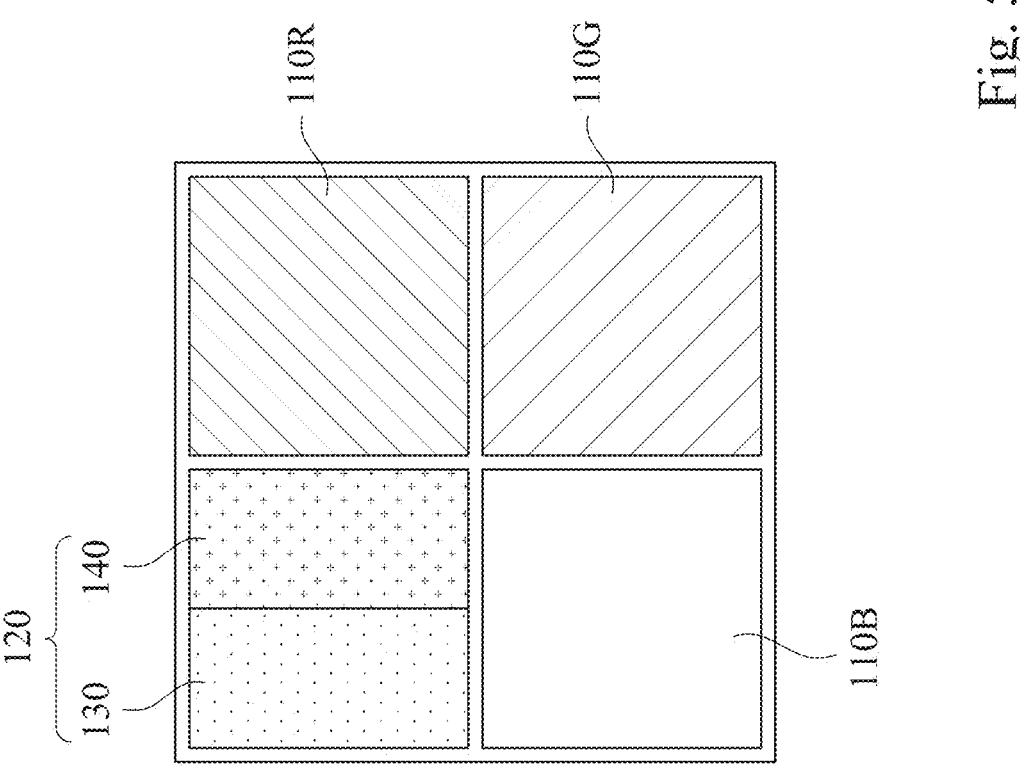

As shown in FIG. 5, the PDAF sensing unit 100A includes sixteen photodiodes 104 arranged in a 4×4 array. The hybrid color filter 120 is disposed on a group of the photodiodes 104 such as first to fourth photodiodes 1041-1044 at the left-top corner. A red mono color filter 110R, a green mono color filter color 110G, and a blue mono color filter 110B are disposed on the rest of the photodiodes 104. In some embodiments, the hybrid color filter 120 and the green mono color filter color 110G are on the diagonal of the PDAF sensing unit 100A, and the filter spectrum of the hybrid color filter 120 is same as the filter spectrum of the green mono color filter color 110G.

The hybrid color filter 120 includes the first material 130 and the second material 140 directly contacting each other without a grid therebetween. The extinction coefficient of the first material 130 is substantially equal to the extinction coefficient of the second material 140, and the index of refraction of the first material 130 is greater than the index of refraction of the second material 140.

The first to fourth photodiodes 1041-1044 are arranged in a 2×2 array, in which the first photodiode 1041 and the fourth photodiode 1044 are on the diagonal, the second photodiode 1042 is disposed adjacent the first photodiode 1041, and the third photodiode 1043 is disposed adjacent the fourth photodiode 1044. The first material 130 of the hybrid color filter 120 is disposed on the first photodiode 1041 and the third photodiode 1043 at the left column, and the second material 140 of the hybrid color filter 120 is disposed on the second photodiode 1042 and the fourth photodiode 1044 at the right column. The first material 130 and the second material 140 may have the same dimension. The shape of each of the first material 130 and the second material 140 may be a rectangle, in the top view.

Figure 6:
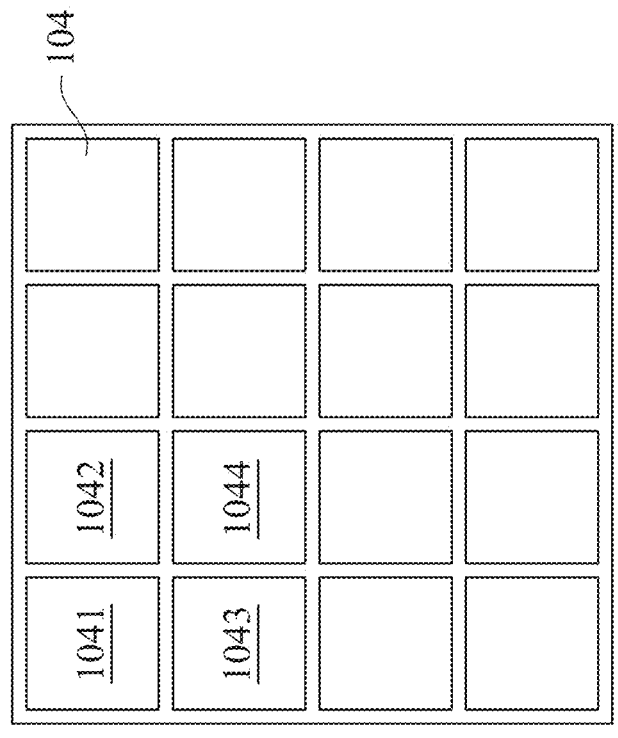
Figure 6:
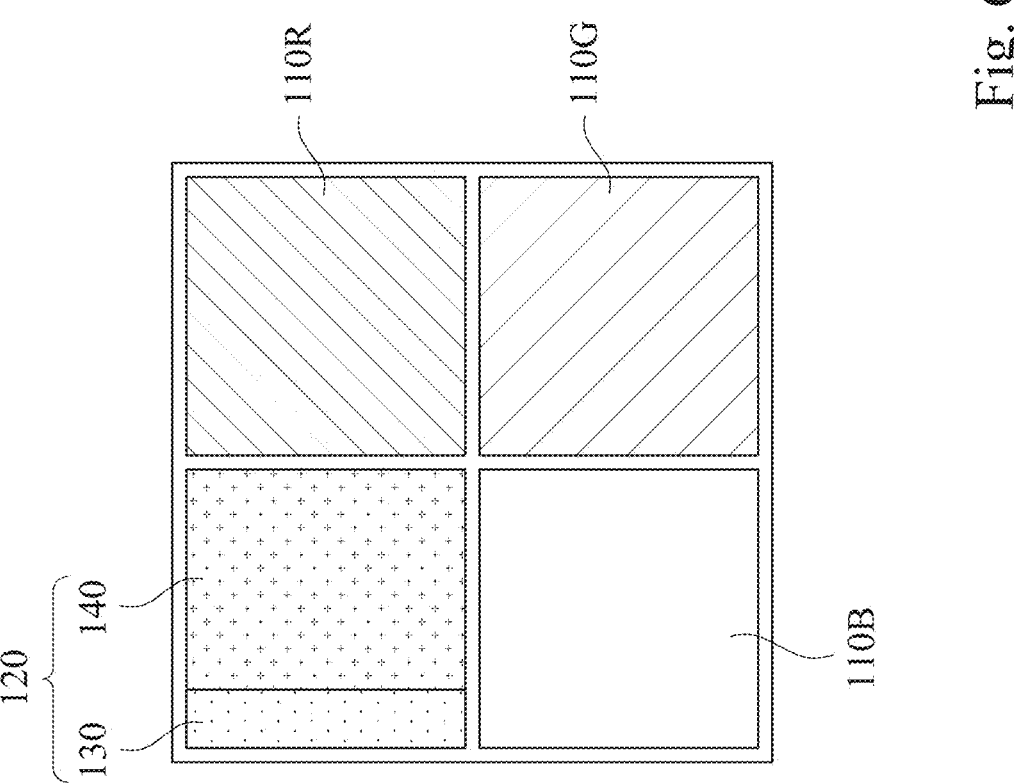

Reference is made to the PDAF sensing unit 100B of FIG. 6. The main difference between the PDAF sensing unit 100B and the PDAF sensing unit 100A is the design of the hybrid color filter 120. In some embodiments, the dimension of the first material 130 is different from the dimension of the second material 140. For example, the dimension of the first material 130 is less than the dimension of the second material 140, and the second material 140 is further disposed on the first photodiode 1041 and the third photodiode 1043.

Figure 7:
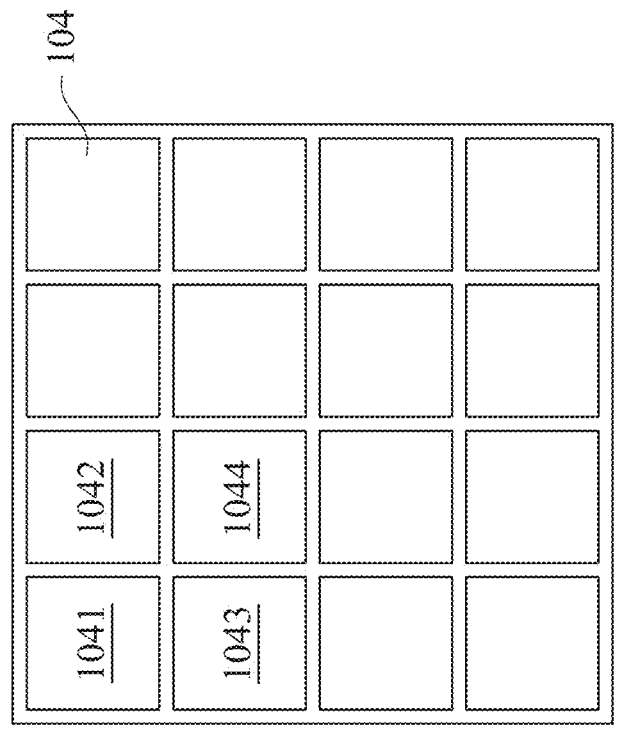
Figure 7:
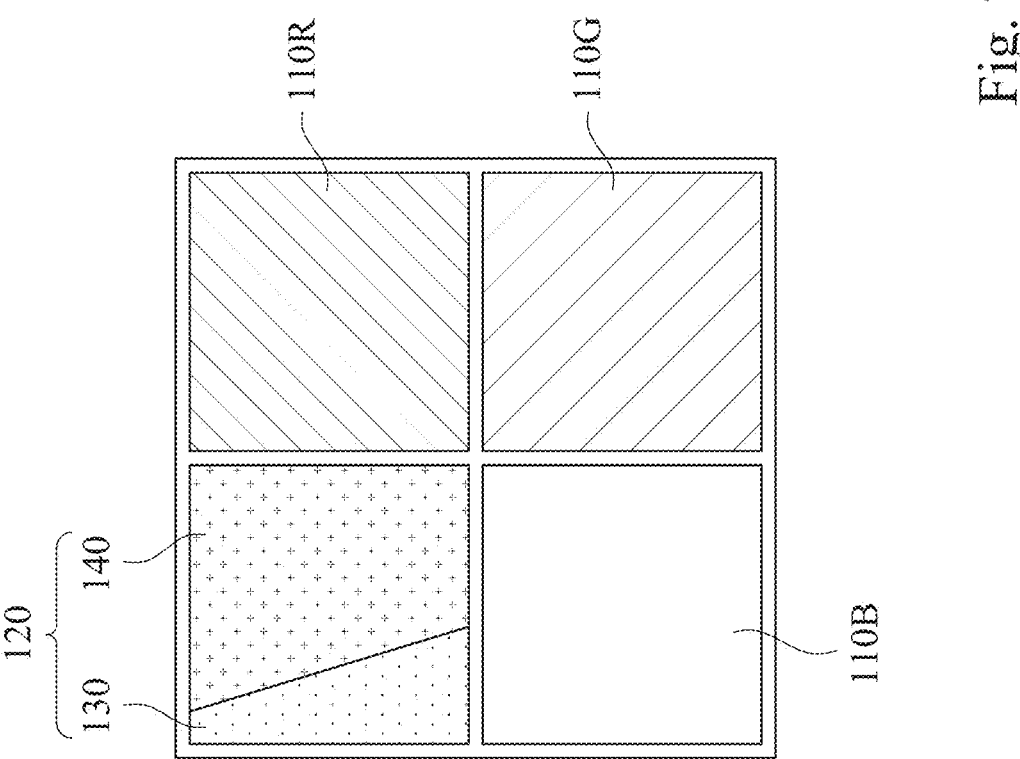

Reference is made to the PDAF sensing unit 100C of FIG. 7. The main difference between the PDAF sensing unit 100C and the PDAF sensing unit 100B is the design of the hybrid color filter 120. In some embodiments, the dimension of the first material 130 is different from the dimension of the second material 140, and the shape of each of the first material 130 and the second material 140 is a trapezoid, in the top view.

Figure 8:
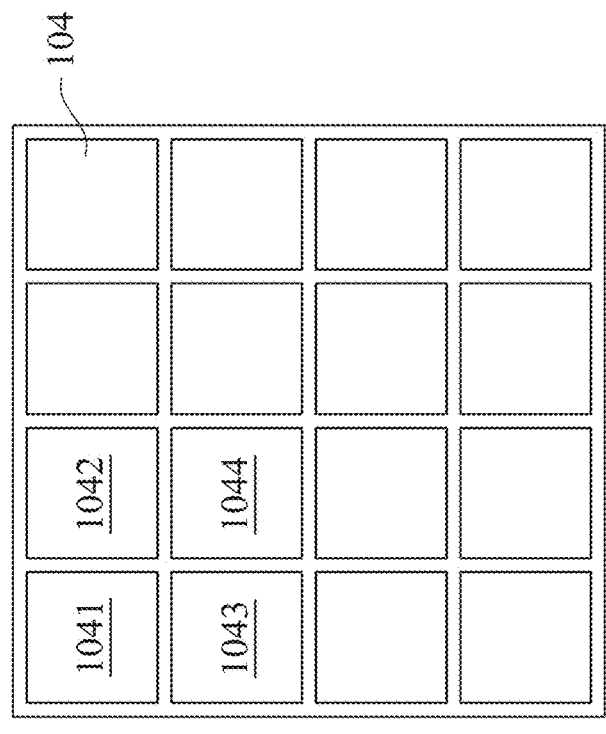
Figure 8:
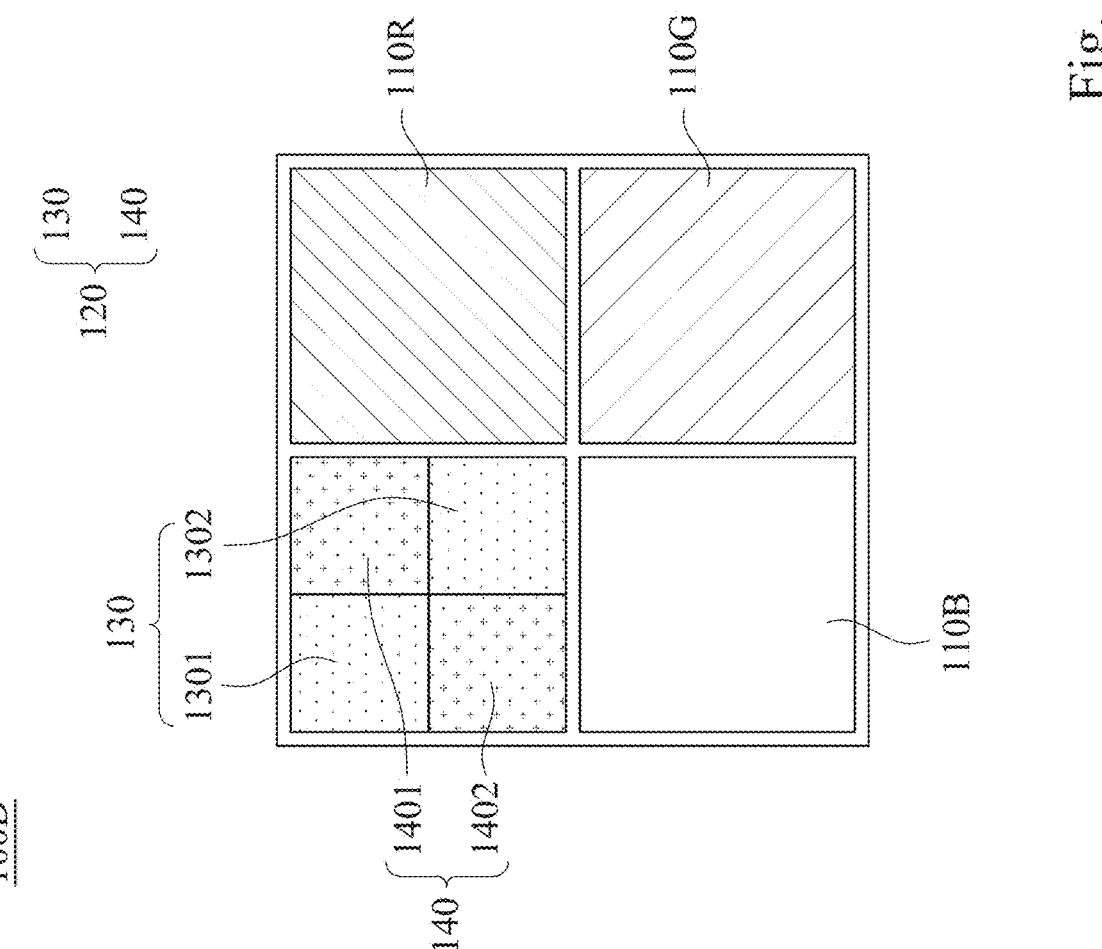

Reference is made to the PDAF sensing unit 100D of FIG. 8. The main difference between the PDAF sensing unit 100D and the PDAF sensing unit 100A is the design of the hybrid color filter 120. In some embodiments, the first material 130 includes portions 1301 and 1302 disposed on diagonal two of the group of the photodiodes 1041-1044 such as on the first photodiode 1041 and the fourth photodiode 1044, and the second material 140 includes portions 1401 and 1402 disposed on other two of the group of the photodiodes 1041-1044 such as on the second photodiode 1042 and the third photodiode 1043.

In some embodiments, the dimension of each of the portions 1301, 1302, 1401, and 1402 of the first material 130 and the second material 140 is the same, and the shape of each of the portions 1301, 1302, 1401, and 1402 of the first material 130 and the second material 140 is a square, in the top view.

Figure 9:
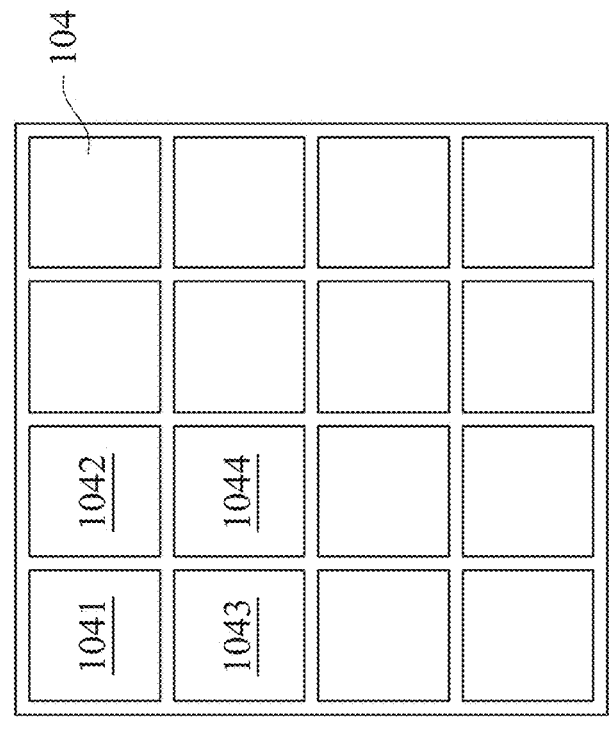
Figure 9:
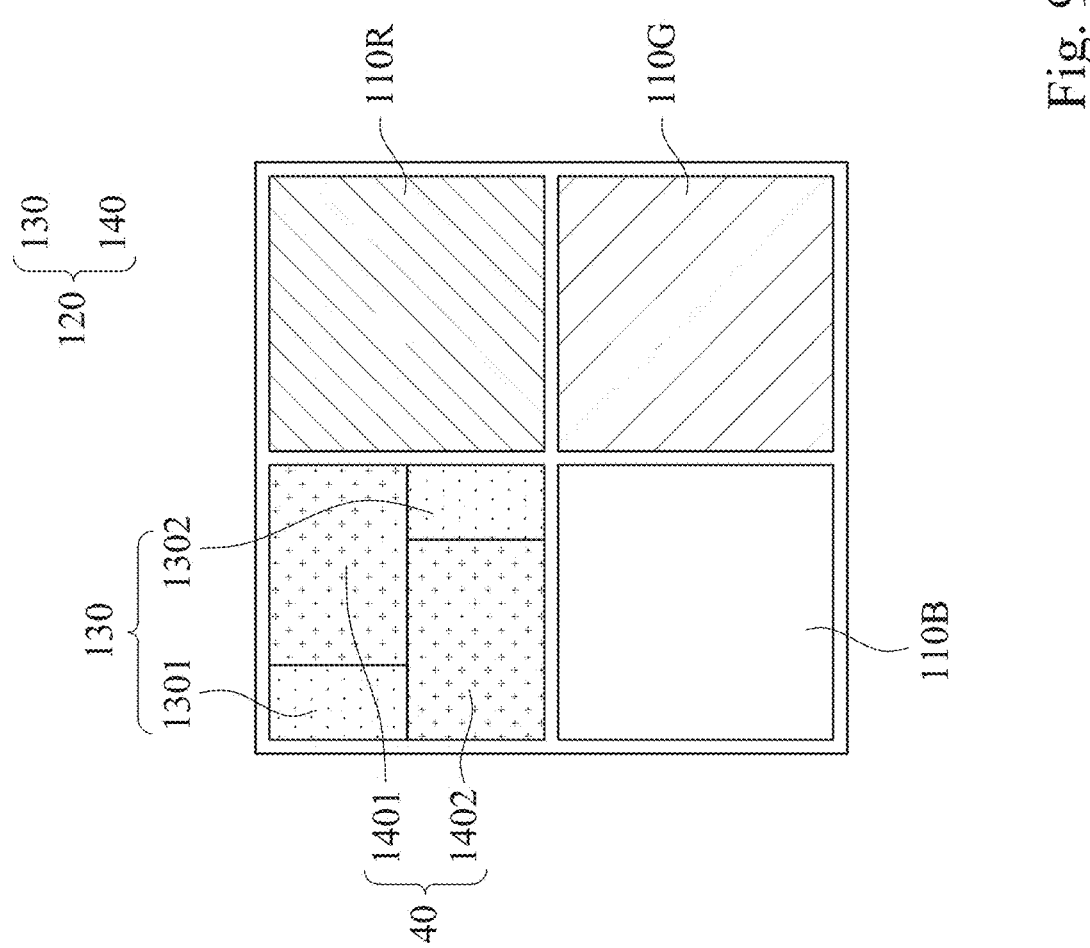

Reference is made to the PDAF sensing unit 100E of FIG. 9. The main difference between the PDAF sensing unit 100E and the PDAF sensing unit 100D is the design of the hybrid color filter 120. In some embodiments, the dimension of each of the portions 1301, 1302, 1401, and 1402 of the first material 130 and the second material 140 may not be the same, and the shape of each of the portions 1301, 1302, 1401, and 1402 of the first material 130 and the second material 140 is a rectangle, in the top view.

Figure 10:
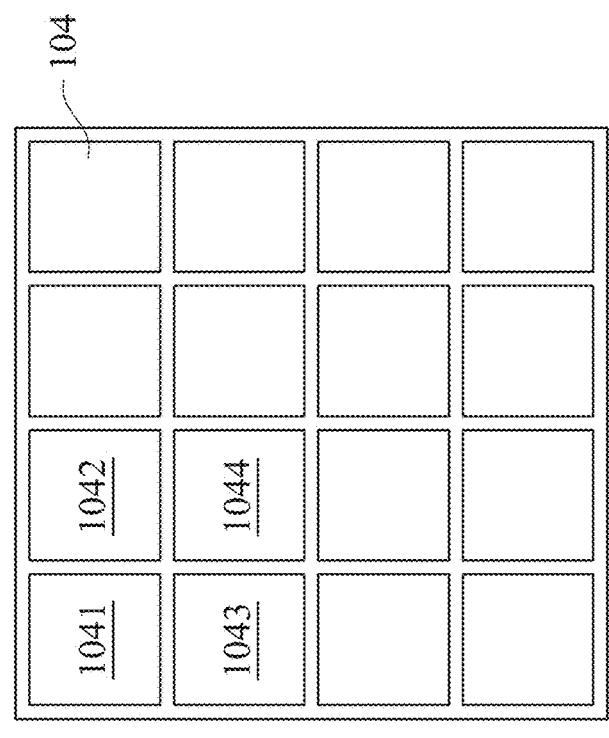
Figure 10:
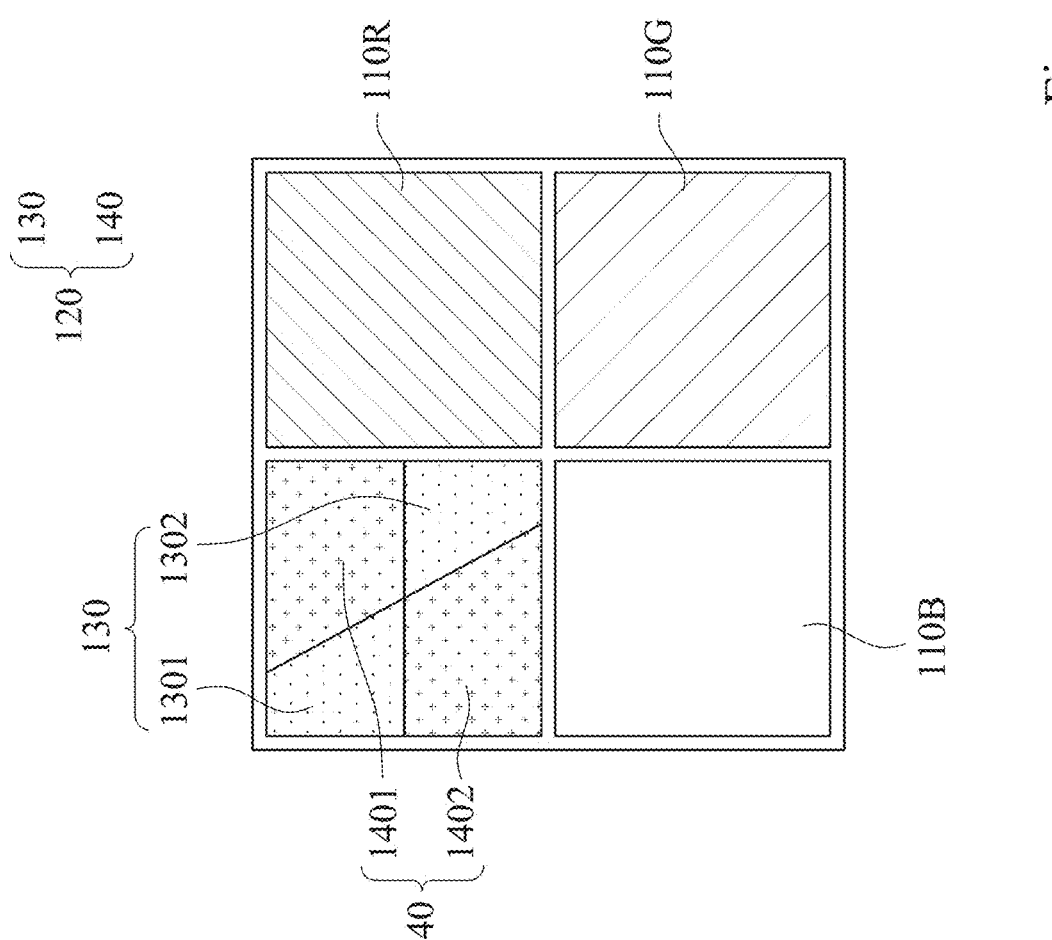

Reference is made to the PDAF sensing unit 100F of FIG. 10. The main difference between the PDAF sensing unit 100F and the PDAF sensing unit 100D is the design of the hybrid color filter 120. In some embodiments, the dimension of each of the portions 1301, 1302, 1401, and 1402 of the first material 130 and the second material 140 may not be the same, and the shape of each of the portions 1301, 1302, 1401, and 1402 of the first material 130 and the second material 140 is a trapezoid, in the top view.

Figure 11:
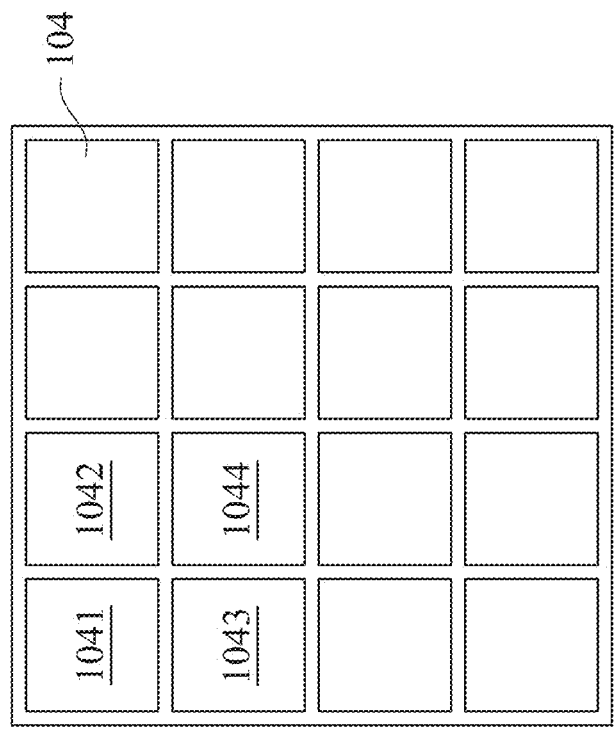
Figure 11:
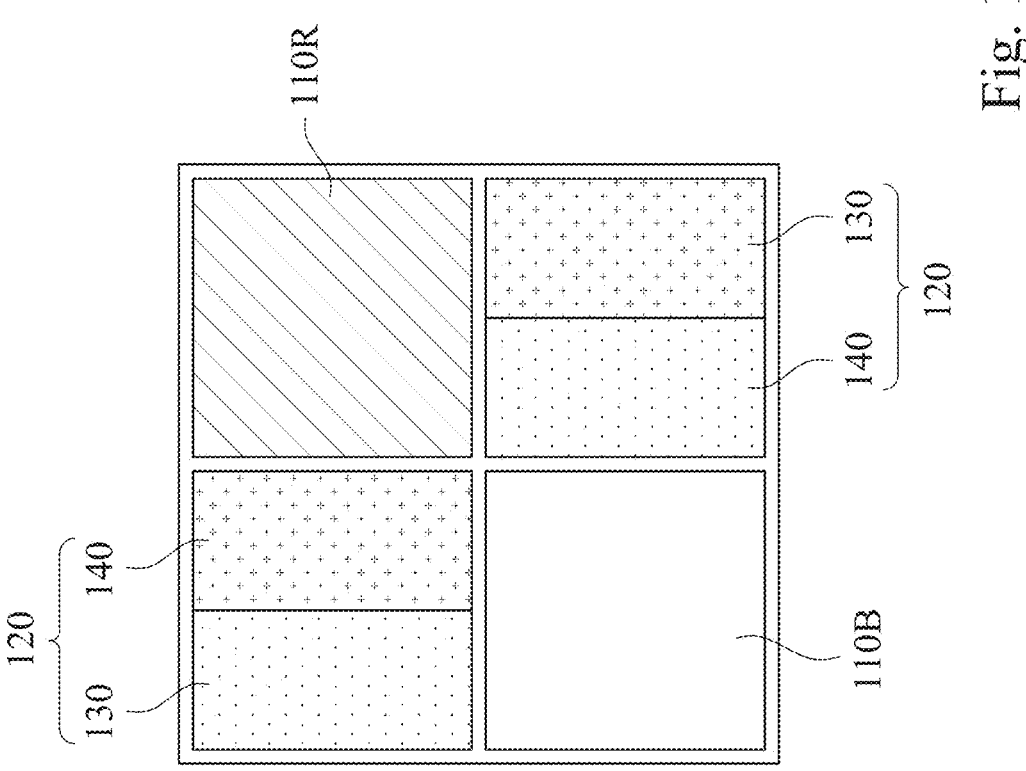

Reference is made to the PDAF sensing unit 100G of FIG. 11. The main difference between the PDAF sensing unit 100G and the PDAF sensing unit 100A includes the green mono color filter color 110G of the PDAF sensing unit 100A is replaced by the hybrid color filter 120. The designs of the first material 130 and the second material 140 of the hybrid color filters 120 may include portions being disposed adjacent or diagonal, the shape of the portions being a square, a rectangle, or a trapezoid, and/or the dimensions of the portions being the same or different.

Figure 12:
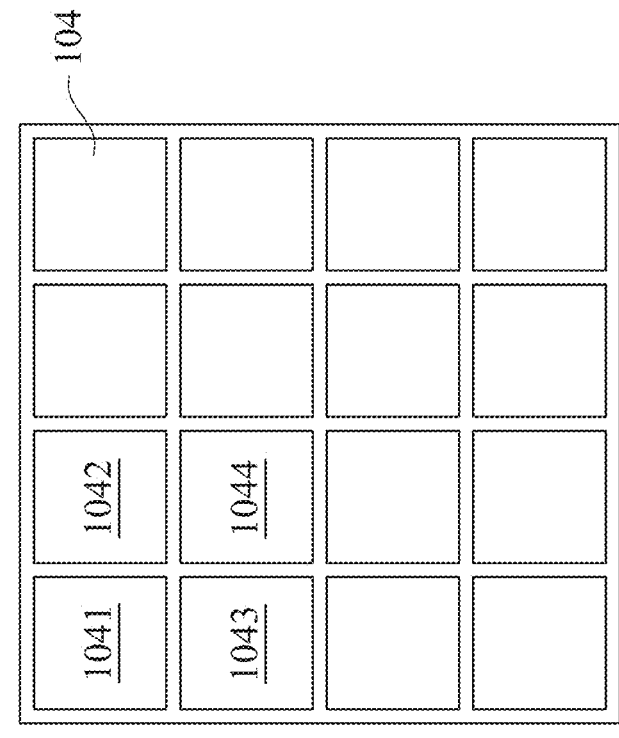
Figure 12:
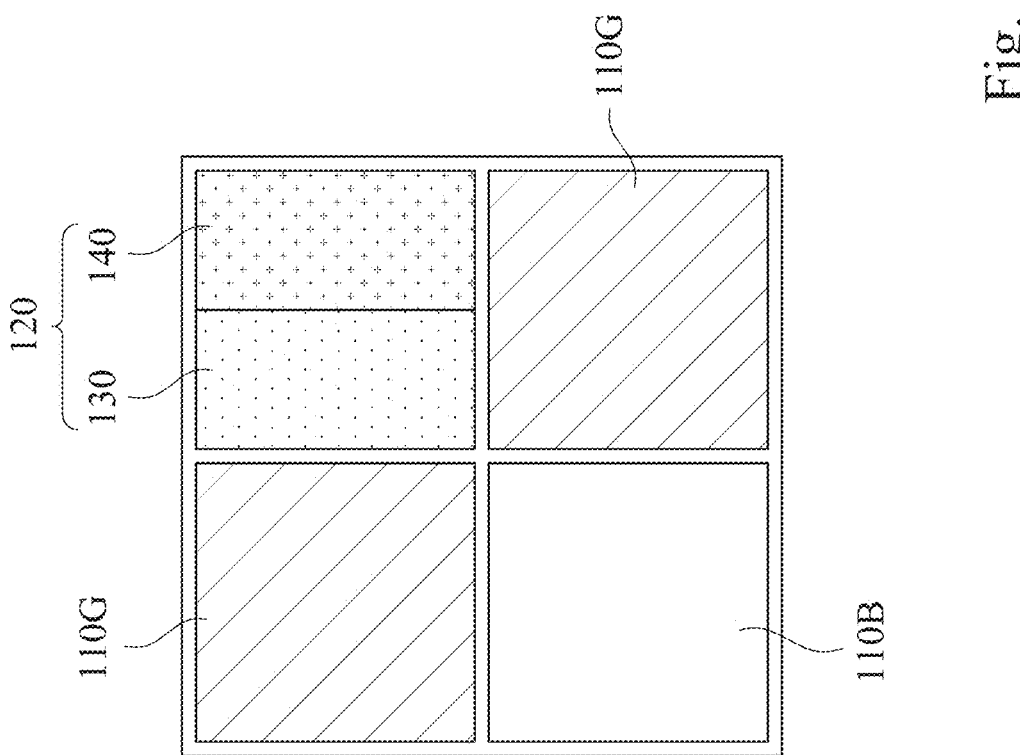

Reference is made to the PDAF sensing unit 100H of FIG. 12. The main difference between the PDAF sensing unit 100H and the PDAF sensing unit 100A includes the red mono color filter color 110R (or the blue mono color filter 110B) of the PDAF sensing unit 100A is replaced by the hybrid color filter 120, and there are two green mono color filters 110G on the diagonal of the PDAF sensing unit 100H. The designs of the first material 130 and the second material 140 of the hybrid color filter 120 may include portions being disposed adjacent or diagonal, the shape of the portions being a square, a rectangle, or a trapezoid, and/or the dimensions of the portions being the same or different.

Figure 13:
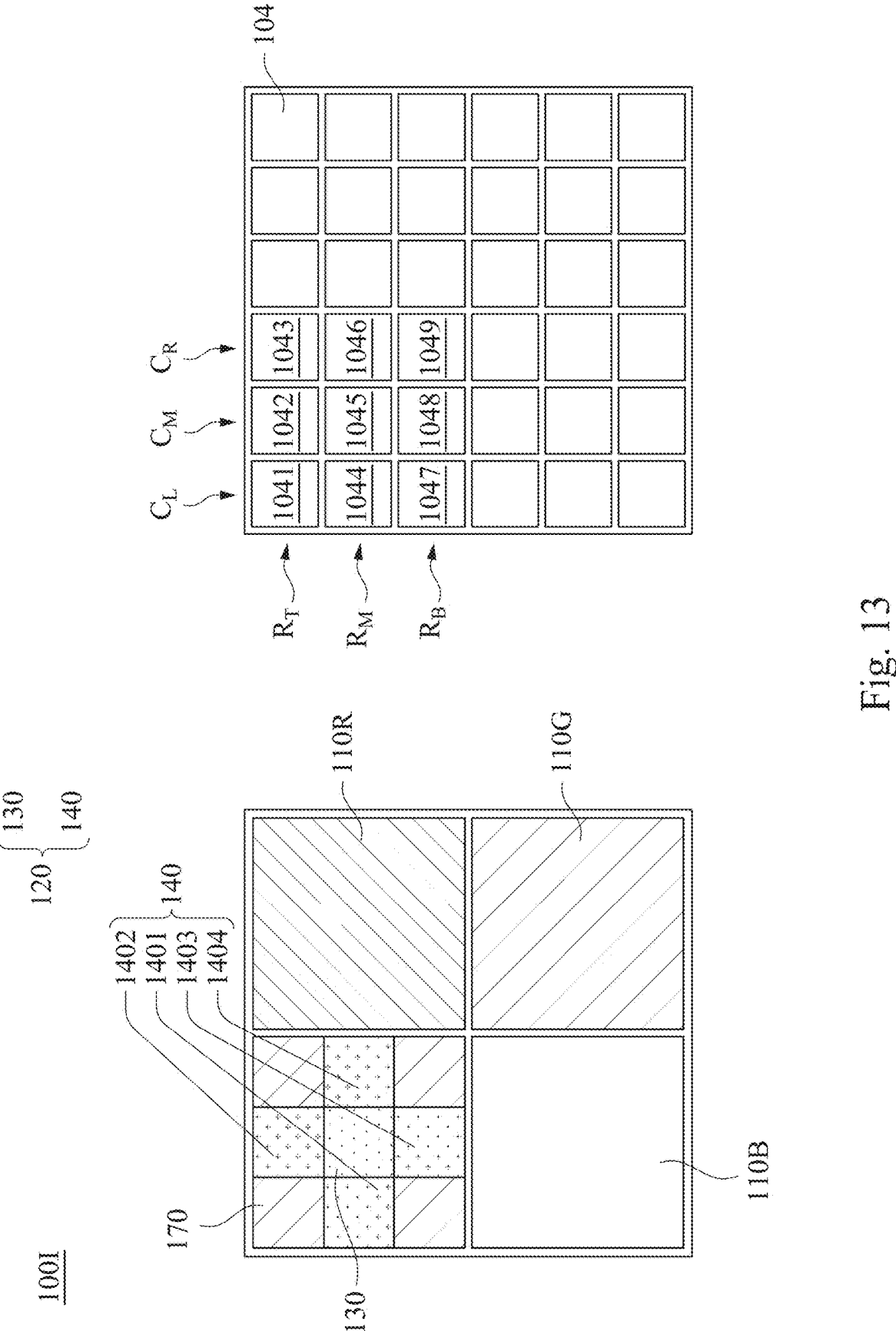

As shown in FIG. 13, the PDAF sensing unit 100I includes thirty-six photodiodes 104 arranged in a 6×6 array. The hybrid color filter 120 is disposed on a group of the photodiodes 104. A red mono color filter 110R, a green mono color filter color 110G, and a blue mono color filter 110B are disposed on the rest of the photodiodes 104. In some embodiments, the hybrid color filter 120 and the green mono color filter color 110G are on the diagonal of the PDAF sensing unit 100I, and the filter spectrum of the hybrid color filter 120 is same as the filter spectrum of the green mono color filter color 110G.

The first to ninth photodiodes 1041-1049 are arranged in a 3×3 array, in which the first to third photodiodes 1041-1043 are at a top row $R_T$, the fourth to sixth photodiodes 1044-1046 are at a middle row $R_M$, and the seventh to ninth photodiodes 1047-1048 are at a bottom row $R_B$. The hybrid color filter 120 is disposed on the middle row $R_M$ and the middle column $C_M$ of the first to ninth photodiodes 1041-1049.

More particularly, the first material 130 of the hybrid color filter 120 is disposed on the fifth photodiode 1045, and the second material 140 of the hybrid color filter 120 includes four portions 1401-1404 disposed on four sides of the first material 130, respectively. The first material 130 and the portions 1401-1404 of the second material 140 directly contact each other without a grid therebetween. The extinction coefficient of the first material 130 is substantially equal to the extinction coefficient of the second material 140, and the index of refraction of the first material 130 is greater or less than the index of refraction of the second material 140. In some embodiments, the dimension of the first material 130 and each of the portions 1401-1404 of the second material 140 is the same, and the shape of first material 130 and each of the portions 1401-1404 of the second material 140 is a square, in the top view.

Additionally, the PDAF sensing unit 100I further includes four mono color filters 170 disposed on four corners of the photodiodes 1041-1049. For example, the mono color filters 170 are disposed on the first, third, seventh, and ninth photodiodes 1041, 1043, 1047, and 1049, respectively. The filter spectrum of the mono color filters 170 is same as a filter spectrum of the hybrid color filter 120 which is also same as the filter spectrum of the green mono color filter 110G.

Figure 14:
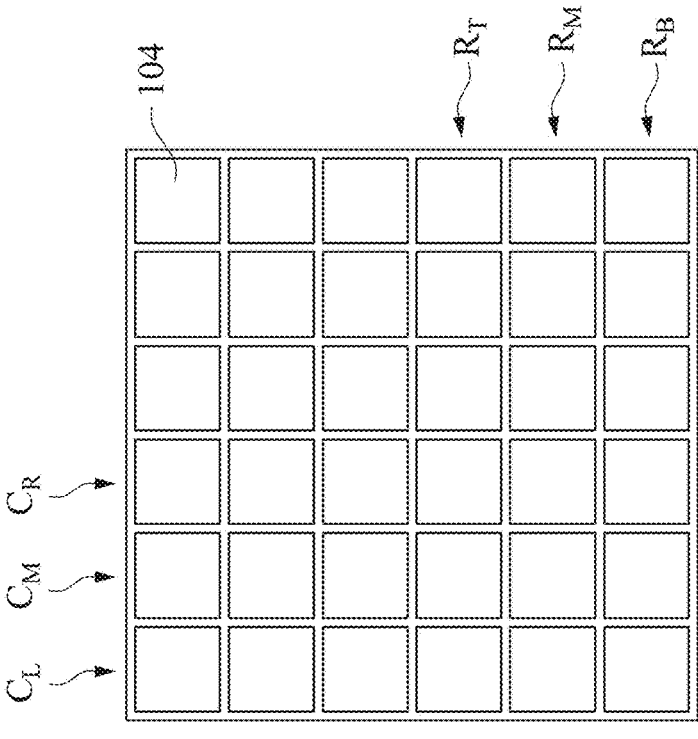

Reference is made to the PDAF sensing unit 100J of FIG. 14. The main difference between the PDAF sensing unit 100J and the PDAF sensing unit 100I includes there are two hybrid color filter colors 120A and 120B disposed on diagonal of the 6×6 array of the photodiodes 104. In the hybrid color filter color 120A, the hybrid color filter 120 is disposed on the middle column $C_M$ of the 3×3 array of the photodiodes 104 at left-top, in which the first material 130 of the hybrid color filter 120A is disposed on the center of the nine photodiodes 104, and the second material 140 of the hybrid color filter 120A includes two portions 1401-1402 disposed on top and bottom sides of the first material 130, respectively. The PDAF sensing unit 100J further includes a two mono color filters 170 disposed on the left column $C_L$ and the right column $C_R$ adjacent the hybrid color filter 120A. The filter spectrum of the mono color filters 170 is same as a filter spectrum of the hybrid color filter 120A.

In the hybrid color filter color 120B, the hybrid color filter 120B is disposed on the middle row $R_M$ of the 3×3 array of the photodiodes 104 at right-bottom, in which the first material 130 of the hybrid color filter 120B is disposed on the center of the nine photodiodes 104, and the second material 140 of the hybrid color filter 120 includes two portions 1401-1402 disposed on left and right sides of the first material 130, respectively. The PDAF sensing unit 100J further includes a two mono color filters 170 disposed on the top row $R_T$ and the bottom row $R_B$ adjacent the hybrid color filter 120B. The filter spectrum of the mono color filters 170 is same as a filter spectrum of the hybrid color filter 120B.

Figure 15:
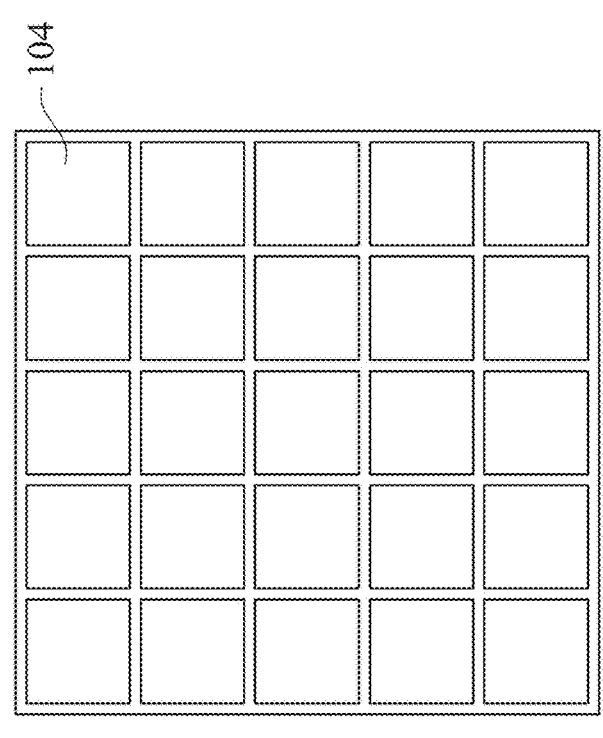
Figure 16:
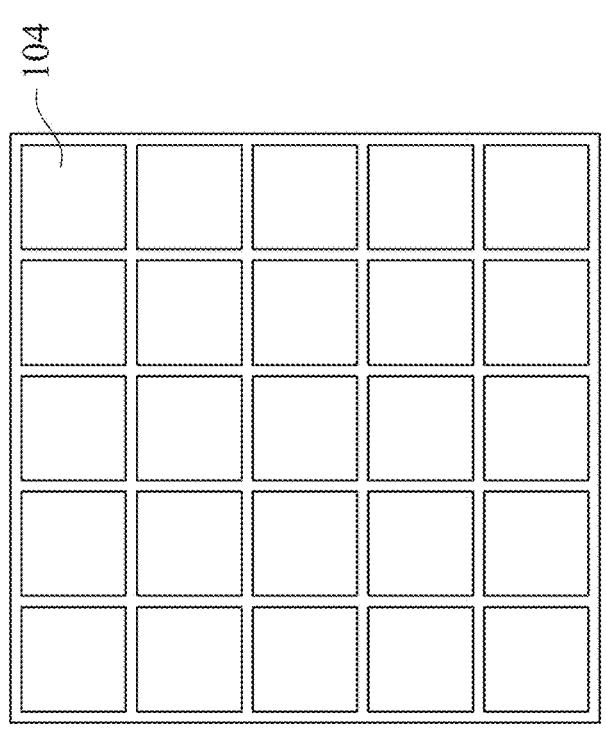

Reference is made to the PDAF sensing unit 100K of FIG. 15 and the PDAF sensing unit 100L of FIG. 16. The PDAF sensing unit 100K and the PDAF sensing unit 100L each includes twenty-five photodiodes 104 arranged in a 5×5 array. The hybrid color filter 120 is disposed on a group of the photodiodes 104. In some embodiments, the hybrid color filter 120 is disposed on the center one of the photodiodes 104, and the second material 140 of the hybrid color filter 120 includes two portions 1401 and 1402 disposed on left and right sides (as shown in FIG. 15) or top and bottom sides (as shown in FIG. 16) of the first material 130, respectively.

In some embodiments, the PDAF sensing unit 100K and the PDAF sensing unit 100L each includes a red mono color filter 110R, two green mono color filter colors 110G, and a blue mono color filter 110B on the rest of the photodiodes 104. In some embodiments, the red mono color filter 110R and the blue mono color filter 110B are disposed diagonally on the photodiodes 104. In some embodiments, the two green mono color filter colors 110G are disposed diagonally on the photodiodes 104, and the filter spectrum of the hybrid color filter 120 is same as the filter spectrum of the green mono color filter colors 110G.

Figures 17, 18:
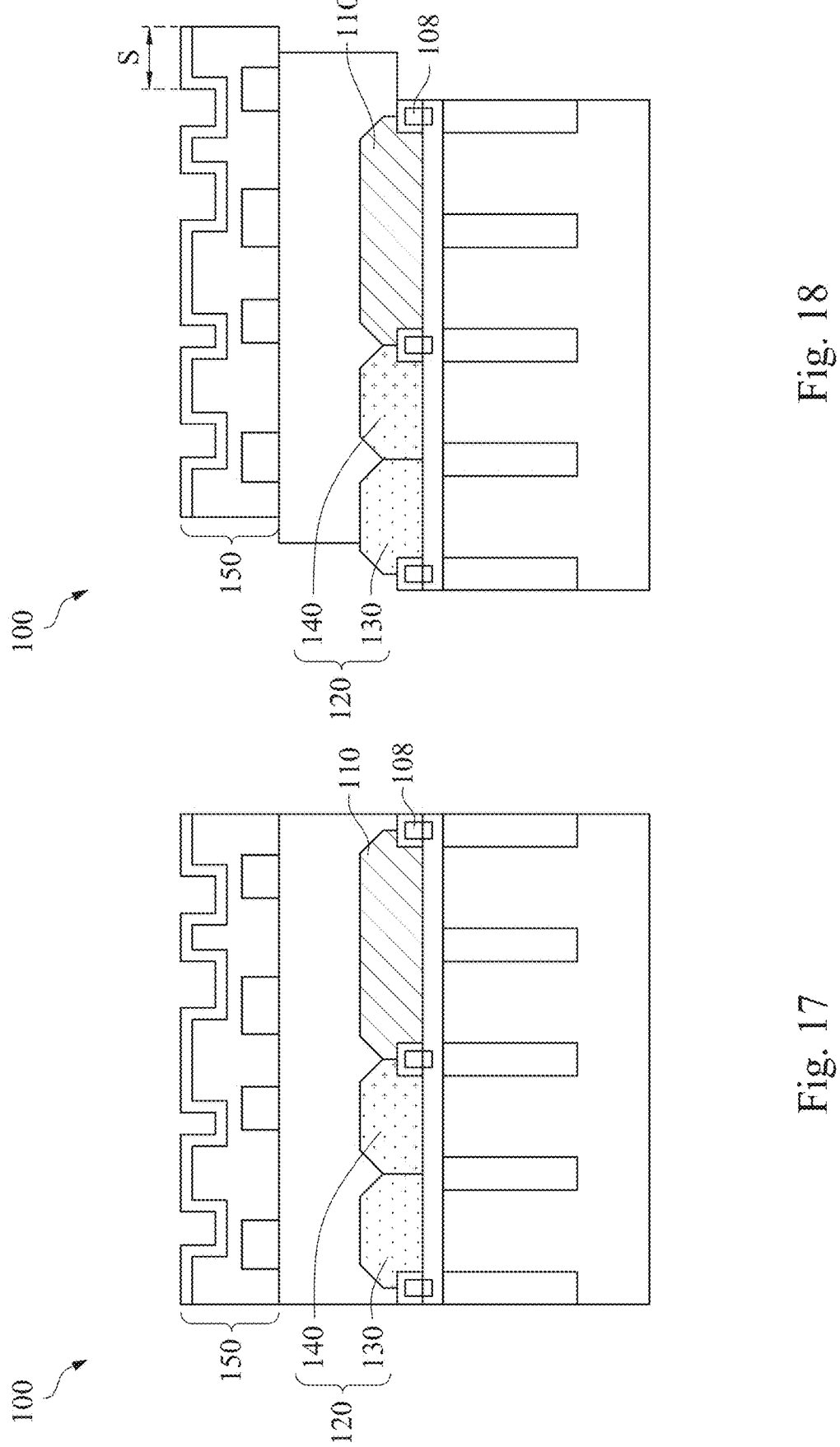
FIG. 17 to FIG. 18 are cross-sectional views of the PDAF sensing unit of the image sensor according to different embodiments of the disclosure, respectively.

Reference is made to FIG. 17 to FIG. 18. FIG. 17 to FIG. 18 are cross-sectional views of the PDAF sensing unit of the image sensor according to different embodiments of the disclosure, respectively. In some embodiments, the design of the respective PDAF sensing units 100 of the image sensor 10 (see FIG. 1) can be varied according to the relative positions on the image sensor 10.

For example, the PDAF sensing unit 100 as shown in FIG. 17 is at the center or close to the center of the image sensor 10. The dimensions of the first material 130 and the second material 140 of the hybrid color filter 120 are the same, and the meta layer 150 (or the micro lens layer 160 in some other embodiments) aligns with the grid 108.

For example, the PDAF sensing unit 100 as shown in FIG. 18 is at the edge or close to the edge of the image sensor 10. The dimensions of the first material 130 and the second material 140 of the hybrid color filter 120 can be different, and the meta layer 150 (or the micro lens layer 160 in some other embodiments) is lateral shifted relative to the mis-aligns with the grid 108 with a shifting S.

According to the embodiments of the disclosure, the image sensor having the PDAF sensing unit is provided. The PDAF sensing unit includes the hybrid color filter including the first material and the second material. The extinction coefficient of the first material is substantially equal to the extinction coefficient of the second material, and the index of refraction of the second material is greater than the index of refraction of the first material. The light plunder behavior caused by the refraction index difference between first and second materials and of the hybrid color filter is introduced to the PDAF sensing unit to increase L/R ratio, and the sensitivity of the PDAF sensing unit is also improved.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. An image sensor comprising:
    a phase detection auto focus sensing unit comprising:
        a plurality of photodiodes; and
        a hybrid color filter disposed on a group of the plurality of photodiodes, wherein the hybrid color filter comprises a first material and a second material directly in contact with each other, an extinction coefficient of the first material is substantially equal to an extinction coefficient of the second material, and an index of refraction of the first material is different from an index of refraction of the second material,
    wherein the first material and the second material satisfy the following equation:

$$|k_L(\lambda_1)-k_R(\lambda_1)|+|k_L(\lambda_2)-k_R(\lambda_2)|+ \ldots +|k_L(\lambda_n)-k_R(\lambda_n)|<(n-1)\times0.01,$$

in which $k_L(\lambda)$ is the extinction coefficient of the first material, $k_R(\lambda)$ is the extinction coefficient of the second material, n is a positive integer, $\lambda$ is a filter spectrum of the hybrid color filter and is in a range from 300 nm to 2000 nm, and wherein a difference between the index of refraction of the first material and the index of refraction of the second material is less than 2.

2. The image sensor of claim 1, wherein a ratio of a dimension of the first material to a dimension of the second material is in a range from 0.5 to 1.5, a sum of a dimension of the first material and a dimension of the second material is equal to a dimension of adjacent two photodiodes of the plurality of photodiodes, and a shape of each of the first material and the second material is a square, a rectangle, or a trapezoid, in a top view.

3. The image sensor of claim 1, further comprising a meta layer disposed on the hybrid color filter, wherein the meta layer comprises a plurality of nano-structures.

4. The image sensor of claim 1, further comprising a micro lens layer disposed on the hybrid color filter.

5. The image sensor of claim 1, wherein the phase detection auto focus sensing unit comprises a grid surrounding the hybrid color filter, and the first material and the second material are free of disposing the grid therebetween.

6. The image sensor of claim 1, wherein the group of photodiodes comprises a first photodiode and a second photodiode disposed adjacent the first photodiode, the first material is disposed on the first photodiode, and the second material is disposed on the second photodiode.

7. The image sensor of claim 1, wherein the group of photodiodes comprises a first photodiode and a second photodiode disposed adjacent the first photodiode, the first material is disposed on the first photodiode, and the second material is disposed on both the first photodiode and the second photodiode.

8. The image sensor of claim 1, wherein the group of photodiodes comprises four photodiodes disposed in a 2×2 array, the first material is disposed on adjacent two of the four photodiodes, and the second material is disposed on two others of the four photodiodes.

9. The image sensor of claim 1, wherein the group of photodiodes comprises four photodiodes disposed in a 2×2 array, the first material comprises two portions disposed on diagonal two of the four photodiodes, respectively, and the second material comprises two portions disposed on two others of the four photodiodes, respectively.

10. The image sensor of claim 1, wherein the plurality of photodiodes comprises nine photodiodes disposed in a 3×3 array, the hybrid color filter is disposed on a middle column of the nine photodiodes, and the second material comprises two portions disposed at opposite sides of the first material, respectively.

11. The image sensor of claim 10, wherein the phase detection auto focus sensing unit comprises two mono color filters disposed on a left column and a right column of the nine photodiodes, respectively, and a filter spectrum of the mono color filters is same as a filter spectrum of the hybrid color filter.

12. The image sensor of claim 1, wherein the plurality of photodiodes comprises nine photodiodes disposed in a 3×3 array, the hybrid color filter is disposed on a middle row of the nine photodiodes, and the second material comprises two portions disposed at opposite sides of the first material, respectively.

13. The image sensor of claim 12, wherein the phase detection auto focus sensing unit comprises two mono color filters disposed on a top row and a bottom row of the nine photodiodes, respectively, and a filter spectrum of the mono color filters is same as a filter spectrum of the hybrid color filter.

14. The image sensor of claim 1, wherein the plurality of photodiodes comprises nine photodiodes disposed in a 3×3 array, the hybrid color filter is disposed on a middle row and a middle column of the nine photodiodes, and the second material comprises four portions disposed at sides of the first material, respectively.

15. The image sensor of claim 14, wherein the phase detection auto focus sensing unit comprises four mono color filters disposed on four corners of the nine photodiodes, respectively, and a filter spectrum of the mono color filters is same as a filter spectrum of the hybrid color filter.

16. The image sensor of claim 1, wherein the plurality of photodiodes comprises twenty-five photodiodes disposed in a 5×5 array, the first material is disposed on a center one of the twenty-five photodiodes, and the second material comprises two portions disposed at opposite sides of the first material, respectively.

17. The image sensor of claim 16, wherein the phase detection auto focus sensing unit comprises a first mono color filter and a second mono color filter disposed diagonally on the plurality of photodiodes, and two third color filters disposed diagonally on the plurality of photodiodes, and a filter spectrum of the third mono color filters is same as a filter spectrum of the hybrid color filter.

18. The image sensor of claim 17, wherein a filter spectrum of the first mono color filter is different from the filter spectrum of the hybrid color filter, and a filter spectrum of the second mono color filter is different from the filter spectrum of the hybrid color filter.

19. The image sensor of claim 1, further comprising an additional hybrid color filter, wherein the hybrid color filter and the additional hybrid color filter are disposed on a diagonal of the plurality of photodiodes, and a filter spectrum of the additional hybrid color filter is same as the filter spectrum of the hybrid color filter.

20. The image sensor of claim 1, wherein the hybrid color filter corresponds to red color, green color, blue color, yellow color, clear color, magenta color, or cyan color.

* * * * *